United States Patent
Hsieh et al.

(10) Patent No.: US 7,027,225 B2
(45) Date of Patent: Apr. 11, 2006

(54) SUBSTRATE INDEPENDENT DISTRIBUTED BRAGG REFLECTOR AND FORMATION METHOD

(75) Inventors: Kuang-Chien Hsieh, Champaign, IL (US); Keh-Yung Cheng, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 26 days.

(21) Appl. No.: 10/462,407

(22) Filed: Jun. 16, 2003

(65) Prior Publication Data

US 2004/0096574 A1   May 20, 2004

Related U.S. Application Data

(62) Division of application No. 09/635,815, filed on Aug. 9, 2000, now Pat. No. 6,599,564.

(51) Int. Cl.
   *G02B 1/10* (2006.01)
   *H01L 33/00* (2006.01)

(52) U.S. Cl. .................. 359/584; 359/586; 257/98; 257/13; 372/43

(58) Field of Classification Search ............... 359/580, 359/586, 584; 372/43, 45, 46, 96; 257/12, 257/13, 98, 49; 427/337
See application file for complete search history.

(56) References Cited

U.S. PATENT DOCUMENTS

| | | | |
|---|---|---|---|
| 3,859,178 A | | 1/1975 | Logan et al. |
| 3,890,169 A | | 6/1975 | Schwartz et al. |
| 3,914,465 A | | 10/1975 | Dyment et al. |
| 3,969,164 A | | 7/1976 | Cho et al. |
| 4,116,722 A | | 9/1978 | Kamei et al. |
| 4,144,634 A | | 3/1979 | Chang et al. |
| 4,172,906 A | | 10/1979 | Pancholy |
| 4,176,206 A | | 11/1979 | Inoue |
| 4,216,036 A | | 8/1980 | Tsang |
| 4,291,327 A | | 9/1981 | Tsang |
| 4,374,867 A | | 2/1983 | Nahory et al. |
| 5,262,360 A | | 11/1993 | Holonyak, Jr. et al. |
| 5,481,120 A | * | 1/1996 | Mochizuki et al. ........... 257/49 |
| 5,568,499 A | | 10/1996 | Lear |
| 5,874,747 A | * | 2/1999 | Redwing et al. ............... 257/77 |
| 6,269,109 B1 | * | 7/2001 | Jewell ........................ 372/43 |
| 6,594,296 B1 | * | 7/2003 | Kaneko ....................... 372/46 |
| 6,674,090 B1 | * | 1/2004 | Chua et al. ................... 257/13 |

FOREIGN PATENT DOCUMENTS

| | | |
|---|---|---|
| EP | 0008898 | 3/1980 |
| JP | 64-2318 | 1/1989 |

OTHER PUBLICATIONS

D.E. Wohlert, H.C. Lin, K.L. Chang, G.W. Pickrell, Jr., J.H. Epple, K.C. Hsieh, K.Y. Cheng, "Fabrication of a Substrate-Independent Aluminum Oxide-GaAs Distributed Bragg Reflector", Applied Physics Letters, vol. 75, No. 10, Sep. 6, 1999, pp. 1371-1373.

G.W. Pickrell, H.C. Lin, K.L. Chang, K.C. Hsieh, K.Y. Cheng, "Fabrication of a GaP/Al-Oxide Distributed Bragg Reflector for the Visible Spectrum", 11th International Conference on MBE.

M.H. MacDougal, S.G. Hummel, P.D. Dapkus, H. Zhao, Y. Cheng, "Epitaxial (Al,Ga)InP-Oxide Distributed Bragg Reflectors for Use in Visible-Wavelength Optical Devices", IEEE Photonics Technology Letters, vol. 7, No. 4, Apr. 1995, pp. 385-387.

J.M. Dallesasse, N. Holonyak, Jr., A.R. Sugg, T.A. Richard, N. El-Zein, "Hydrolyzation Oxidation of $Al_xGa_{1-x}As$-AlAs-GaAs Quantum Well Heterostructures and Superlattices", Appl. Phys. Lett., vol. 57, No. 26, Dec. 24, 1990, pp. 2844-2846.

M.J. Ries, T.A. Richard, S.A. Maranowski, N. Holonyak, Jr., E.I. Chen, "Photopumped Room-Temperature Edge- and Vertical-Cavity Operation of AlGaAs-GaAs-InGaAs Quantum-Well Heterostructur Lasers Utilizing Native Oxide Mirrors", Appl. Phys. Lett., vol. 65, No. 6, Aug. 8, 1994, pp. 740-741.

(Continued)

*Primary Examiner*—Audrey Chang
(74) *Attorney, Agent, or Firm*—Greer, Burns & Crain, Ltd.

(57) ABSTRACT

Distributed Bragg reflectors may be formed in fewer layers by the method, which is capable of producing greater differences in indexes of refraction. Group III–V alternating layers are deposited. The microstructure of alternating layers is controlled to be different. A combination of alternating polycrystalline layers or amorphous and polycrystalline layers results. Alternate ones of the layers oxidize more quickly than the others. A lateral wet oxidation of the alternate ones of the layers produces a structure with large differences in indexes of refraction between adjacent layers. The microstructure between alternating layers may be controlled by controlling Group V overpressure alone or in combination with growth temperature.

12 Claims, No Drawings

OTHER PUBLICATIONS

Rubenstein, M., "The Oxidation of GaP & GaAs", Journal of Electrochem. Soc., vol. 113, No. 6, Jun. 1966, pp. 540-542.

Schwartz, B. "Preliminary Results on the Oxidation of GaAs and GaP during Chemical Etching", Journal of Electrochem. Soc., vol. 118, No. 4, Apr. 1971, pp. 657-658.

H. Barbe, et al., "The Growth of thin oxide layers on GaAs in methanol", Semiconductor Science and Technology, 3, pp. 853-858 (1988).

J. P. Contour, et al., "An XPS Study of the Passivating Oxide Layer Product Produced on GaAs (001) Substrate by Heating in Air above 200EC", Japanese Journal of Applied Physics, vol. 27, No. 2, pp. L167-L169 (Feb., 1988).

S. P. Murarka, "Thermal oxidation of GaAs", Applied Physics Letters, vol. 26, No. 4, pp. 180-181 (Feb. 25, 1975).

R.P.H. Chang et al., "Plasma oxidation of GaAs", Applied Physics Letters, vol. 29, No. 1, pp. 56-58 (Jul. 1, 1976).

Y. Gao, et al., "Growth of Al oxide layers on GaAs (100) by reaction with condensed molecular oxygen", Journal of Applied Physics, 67(11), pp. 7148-7151 (Jun. 1, 1990).

C. W. Wilmsen, et al. "The Improvement of Grown Oxides for the Surface Protection of III-V Compounds", Thin Solid Films, 51, pp. 93-98 (1978).

M. Hirose, et al., Physica Status Solidi, "Growth of $Al_2O_3$ Layer on MBE GaAs" (a)45, pp. K175-K177 (1978).

J. M. Dallesasse, et al., "Environmental degradation of $Al_xGa_{1-x}$ As-GaAs quantum-well heterostructures", J. Appl. Phys., vol. 68, No. 5, pp, 2235-2238, (Sep. 1, 1990).

P. H. Chang, et al., "Physical and electrical properties of plasma-grown oxide on $Ga_{0.64}Al_{0.36}As$", J. Appl. Phys., vol. 48, No. 12, pp. 5384-5386, (Dec. 1977).

John W. Diggle and Ashok K. Vijh, "The Anodic Behavior of Metals and Semiconductors Series", vol. 4, "Oxides and Oxide Films", Eds. Marcel Dekker, Inc., pp. 190-191, 250-251 (1976).

J.C. Bailar Jr., et al., "Comprehensive Inorganic Chemistry", Eds. Pergarnon Press, pp. 1032-1036, 1090-1093 (1973).

V.G. Hill, et al. "Th System Alumina—Gallia—Water", Journal of the American Ceramic Society, vol. 35, No. 6, pp. 135-142, (Jun. 1, 1952).

G.C. Kennedy, "Phase Relations in the System $Al_2O_3$—$H_2O$ at High Temperatures and Pressures", American Journal of Science, vol. 257, pp. 563-573 (Oct. 1959).

S. Matsushima, et al., "A Study of Equilibrium Relations in the Systems $Al_2O_3$-$SiO_2$-$H_2O$ and $Al_2O_3$-$H_2O$", American Journal of Science, vol. 265, pp. 28-44, (Jan. 1967).

E. M. Levin, et al., Phase Diagrams for Ceramists (1964) and Phase Diagrams for Ceramists 1975 Supplement, M. Reser, Ed., The American Ceramic Society, FIGS. 1926, 1927, 4021, 4965, 2008 and 310.

Chanakya Misra, "Industrial Alumina Chemicals" and Aluminum Oxide and Hydroxides, pp. 8, 10, 12, 14, 16, 18, 20, 22, 24, 26, 28 and 30, AIndustrial Production of Aluminum Hydroxides, p.30, AActivated Aluminas, pp. 73-94, American Chemical Society, Washington, D.C. (1986) ACS Monography 184.

* cited by examiner

SUBSTRATE INDEPENDENT DISTRIBUTED BRAGG REFLECTOR AND FORMATION METHOD

CROSS-REFERENCE TO RELATED APPLICATIONS AND PRIORITY CLAIM

This Application is a divisional application of application Ser. No. 09/635,815, filed Aug. 9, 2000 now U.S. Pat. No. 6,599,564.

STATEMENT OF GOVERNMENT INTEREST

This invention was made with United States government assistance through National Science Foundation (NSF) Grant No. ECD 89-43166 and DARPA Grant No. F49620-98-0496. The government has certain rights in this invention.

FIELD OF THE INVENTION

The present invention is in the opto-electronics field.

BACKGROUND OF THE INVENTION

Distributed Bragg Reflectors (DBRs) are a fundamental component of optical devices requiring an optical gain, such as various types of semiconductor lasers. Conventional vertical DBR's are formed from lattice-matched alternating semiconductor layered materials. These materials provide a small difference in index of refraction between adjacent layers. As a result, a high number of pairs are required in a conventionally formed DBR to obtain desired reflectivities, e.g., about 25 to 40 pairs to attain reflectivities as high as 99.9%, depending on the difference of the index of refraction in adjacent layers.

Lateral wet oxidation has been used to form a DBR in single crystal semiconductor materials. Al-bearing semiconductors are oxidized, and the technique has produced DBRs in, for example, vertical-cavity surface-emitting lasers. Operation of these types of devices was possible in certain wavelength ranges. Long wavelength devices were not realized due to a lack of high quality oxide layer in the laterally oxidized semiconductor devices. In addition, portions of the visible spectrum were not supported by the DBR's formed by oxidation due to absorption of light. These types of DBRs are also limited to lattice matched substrates, limiting their application.

Thus, there is a need for an improved DBR and a method for forming DBRs which addresses the aforementioned drawbacks. The method of the invention is directed to this need.

SUMMARY OF THE INVENTION

In the method of the invention, Group III–V alternating layers are deposited. The microstructure of alternating layers is controlled to be different during deposit. A combination of alternating polycrystalline layers or amorphous and polycrystalline layers results. Alternate ones of the layers oxidize more quickly than the others. A lateral wet oxidation of the alternate ones of the layers produces a structure with large differences in indexes of refraction between adjacent layers. The microstructure between alternating layers may be controlled by controlling Group V overpressure alone or in combination with growth temperature and rate.

The polycrystalline and amorphous materials allow the reflector to be deposited on any host substrate or device. Changing the thickness of constituent layers allows creating of reflectors for a wide variety of wavelengths. Highly reflective DBRs which reflect in the short wavelength portions of the visible spectrum and deep into the ultra-violet wavelengths can be formed by the method. The high-energy bandgap materials provide an advantage during processing because of their resistance to oxidation. This permits oxidation at higher temperatures, leading to faster oxidation rates and higher throughput.

DETAILED DESCRIPTION OF THE PREFERRED EMBODIMENTS

The invention alters microstructure between formation of adjacent Group III–V polycrystalline or amorphous layers to create layers that oxidize at greatly different rates. A lateral wet oxidation then produces a significant difference in index of refraction between adjacent layers. Highly reflective DBRs formed by the invention may be realized with only a few layers due to the large difference in index of refraction.

DBRs may be formed by any suitable Group III–V formation method in accordance with the invention. Molecular beam epitaxy (MBE) offers some advantages. It permits very accurate control of layer thickness. In addition, the use of MBE permits formation of DBR material immediately following formation of a device structure without breaking vacuum in the system used to grow a device including a DBR. However, MBE is not required to practice the invention. Exemplary devices discussed in this application were formed by MBE.

The invention requires formation of alternating Group III–V layers of either alternate polycrystalline or alternate polycrystalline and amorphous materials. The microstructure of the alternating layers is controlled to produce greatly varying, i.e., by about ten times or more, oxidation rates between adjacent layers. The polycrystalline and amorphous material layers permit greater variance in oxidation rate compared to the single crystal materials for a comparable oxidation temperature. This permits a lateral oxidation to create a large difference in index of refraction between adjacent layers. The change in micro crystal structure between adjacent layers may be realized by controlling Group V overpressure with or independent of growth temperature.

DBRs formed by the invention do not require lattice matching to the underlying material due to the use of an amorphous or polycrystalline material on the underlying material. Manipulating the growth temperature, group V overpressure, and growth rate can accurately control microstructure of the alternating layers.

The reflectivity of a DBR is a function of the difference in the index of refraction between the two adjacent layers and the number of pairs of these layers. The invention increases the difference in the index of refraction between adjacent layers due to the oxidation of alternate layers occurring at a higher rate than intervening layers. A fewer number of pairs are therefore needed to obtain a high reflectivity. An added advantage is a much wider bandwidth of the reflectivity spectrum.

An exemplary DBR was formed including polycrystalline GaAs layers alternating with amorphous AlAs layers. By depositing the materials at relatively low growth temperatures of 100° C. at a growth rate of 0.5 monolayer (ML)/s, the arsenic overpressure was changed resulting in amorphous compounds for higher overpressures ($2\times10^{-7}$ torr) and polycrystalline materials for lower overpressures ($8\times10^{-8}$ torr). The material was further processed to laterally oxidize the amorphous (Al,As) layers forming an Al-oxide/GaAs DBR. Polycrystalline AlAs layers can be used for the wet oxidation as well. Oxidation temperatures of 300° C. were used to convert the AlAs to its oxide. The Al-oxide has a much lower index of refraction, around 1.48, as compared to the semiconductor material that has a refractive index of about 3.36. Polycrystalline GaAs layers withstand higher oxidation temperatures than the amorphous (Al,As) layers.

The ability to control the micro crystal structure to practice the method of the invention has been demonstrated by adjusting the As flux and substrate temperature in exemplary devices to deposit GaAs or AlAs with different crystal structures. Specifically, structures can be epitaxial single crystalline on a GaAs substrate if the growth temperature is high, e.g., 580° C. The structures become polycrystalline if the growth temperature is reduced to below 150° C. In this case, they can be deposited on any substrates (not necessarily on GaAs substrates). Lowering the substrate temperature even further to below 100° C. makes the (Ga,As) or (Al,As) become amorphous. The temperatures at which deposited layers become polycrystalline or amorphous is also dependent on the amount of As flux. In short, lower temperatures and higher As fluxes favor the formation of polycrystals to ultimately amorphous materials.

The formation of DBRs using the present method is not restricted to the materials of GaAs and AlAs. Due to absorption of light at shorter wavelengths, GaAs is not useful for DBR applications in the visible spectrum. By simply replacing the GaAs layers with GaP, a DBR was formed which reflects in the visible spectrum covering the important red-yellow-green wavelengths. The control of the microstructure of the GaP material was similarly achieved through the manipulation of the group V overpressure, in this case phosphorus. While the obvious advantage of using GaP is the transparency of the material at wavelengths of greater than 550 nm, an additional advantage is the higher oxidation temperatures allowed. GaP can withstand much higher oxidation temperatures than GaAs allowing the fabrication of the visible-spectrum DBR at higher oxidation temperatures of 450° C. Higher oxidation temperatures simplify material processing procedures.

The use of amorphous (Al,As) for the oxide layer is not required. Other Al-bearing compounds, such as amorphous or polycrystalline $Al_xGa_{1-x}P$, can be used depending on the application. The present method can also be applied to the nitride material system using an $Al_xIn_yGa_{1-x-y}N$/Al-oxide DBR prepared by a similar procedure. For example, polycrystalline GaN or AlInGaN containing a low composition of Al can be used as the non-oxidized layer while amorphous or polycrystalline AlInGaN with a high composition of aluminum can be deposited and then oxidized for the oxide layer in the DBR structure. This permits fabrication of DBRs in the blue and violet part of the visible spectrum and possibly ultraviolet applications.

The significance of making substrate-independent polycrystalline and amorphous materials is that they can be wet oxidized much faster than their single crystalline counterparts. For III–V semiconductor materials, Al-bearing compounds oxidize much faster than non-Al-bearing compounds. Controlling the crystal structure allows alternating layered structures consisting of amorphous/polycrystalline Al-bearing layers and intervening non-Al-bearing polycrystalline layers. Differential oxidation rates between alternating layers can be enhanced by not only the difference in composition (Al-bearing vs. non-Al-bearing) but also the difference in structure (amorphous vs. crystalline).

Wet oxidation of the multi-layer structure produces an efficient Distributed Bragg Reflector (DBR) by converting the Al-bearing semiconductor layer to Al-bearing oxide layer and leaving the non-Al-bearing semiconductor layer intact because of the difference in oxidation rate. The large difference in refraction indices between the Al-bearing oxide and non-Al-bearing semiconductor layer makes it a better DBR requiring fewer pairs to achieve a high reflectivity.

Other Group III–V materials systems will be apparent to artisans. The method of the invention produces DBRs in which adjacent layers have relative differences in indices of refraction exceeding 50%. Some alternate combinations are now listed with an indication of the wavelengths reflected. In the structures listed below: "a" indicates amorphous, "p" indicates polycrystalline, and "n" indicates the index of refraction.

DBR Structure #1
a-AlAs
p-GaAs
n1=3.1/n2=3.6
After differential oxidation, the a-AlAs becomes $a-Al_2O_3$ by losing As resulting in:
$a-Al_2O_3$
p-GaAs
n1=1.5/n2=3.6
The DBR won't absorb light whose wavelength is longer than 8800 Å so it is a good DBR design to reflect light longer than 8800 Å, i.e. near infrared and beyond.

DBR Structure #2
p-AlAs/p-GaAs n1=3.2/n2=3.4
After differential oxidation, the p-AlAs becomes $a-Al_2O_3$ by losing As.
$a-Al_2O_3$/p-GaAs n1=1.6/n2=3.4
The DBR won't absorb light whose wavelength is longer than 8800 Å so it is a good DBR design to reflect light longer than 8800 Å, i.e. near infrared and beyond.

DBR Structure #3
a-AlAs
p-GaP
n1=3.1/n2=3.37
After differential oxidation, the a-AlAs becomes $a-Al_2O_3$ by losing As resulting in:
$a-Al_2O_3$
p-GaP
n1=1.5/n2=3.37
The DBR won't absorb light whose wavelength is longer than 5500 Å so it is a good DBR design to reflect light longer than 5500 Å, i.e. yellow-green and beyond.

DBR Structure #4
p-AlAs/p-GaP n1=3.2/n2=3.37
After differential oxidation, the p-AlAs becomes $a-Al_2O_3$ by losing As.
$a-Al_2O_3$/p-GaP n1=1.6/n2=3.37
The DBR won't absorb light whose wavelength is longer than 5500 Å so it is a good DBR design to reflect light longer than 5500 Å, i.e. yellow-green and beyond.

DBR Structure #5
a-InAlP
p-GaP
n1=3.2/n2=3.37

After differential oxidation, the a-InAlP becomes a-InAlPO$_4$, resulting in:
a-InAlPO$_4$
p-GaP
n1=1.6/n2=3.37

The DBR won't absorb light whose wavelength is longer than 5500 Å so it is a good DBR design to reflect light longer than 5500 Å, i.e. yellow-green and beyond.

DBR Structure #6
a-AlP
p-GaP
n1=3.0/n2=3.37

After differential oxidation, the a-AlP becomes a-AlPO$_4$ resulting in:
a-AlPO$_4$
p-GaP
n1=1.6/n2=3.37

The DBR won't absorb light whose wavelength is longer than 5500 Å so it is a good DBR design to reflect light longer than 5500 Å, i.e. yellow-green and beyond.

DBR Structure #7
a-Al$_x$Ga$_{1-x}$P
p-GaP
n1=3.3/n2=3.37 (where x>0.9)

After differential oxidation, the a-Al$_x$Ga$_{1-x}$P becomes a-Al$_x$Ga$_{1-x}$PO$_4$ resulting in:
a-Al$_x$Ga$_{1-x}$PO$_4$
p-GaP
n1=1.6/n2=3.37

The DBR won't absorb light whose wavelength is longer than 5500 Å so it is a good DBR design to reflect light longer than 5500 Å, i.e. yellow-green and beyond.

DBR Structure #8
a-Al$_x$Ga$_{1-x}$P
p-GaN
n1=3.3/n2=2.4 (where x>0.9)

After differential oxidation, the a-Al$_x$Ga$_{1-x}$P becomes a-Al$_x$Ga$_{1-x}$PO$_4$ resulting in
a-Al$_x$Ga$_{1-x}$PO$_4$
p-GaN
n1=1.6/n2=2.4

The DBR won't absorb light whose wavelength is longer than 3600 Å so it is a good DBR design to reflect light longer than 3600 Å, i.e. near ultraviolet and beyond.

DBR Structure #9
a-Al$_x$In$_y$Ga$_{1-x-y}$N
p-GaN
(unmeasured refraction indexes)

After differential oxidation, the a-Al$_x$In$_y$Ga$_{1-x-y}$N becomes a-Al$_x$In$_y$Ga$_{1-x-y}$N O$_z$ resulting in
a-Al$_x$In$_y$Ga$_{1-x-y}$NO$_z$
p-GaN The DBR won't absorb light whose wavelength is longer than 3600 Å so it is a good DBR design to reflect light longer than 3600 Å, i.e. near ultraviolet and beyond.

In the exemplary DBR structures, an advantage of using phosphide rather than arsenide as the oxide layer is that the phosphide oxide is stronger when the gallium or indium content is higher than about 6–10%.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A distributed Bragg reflector, comprising:
   a first Group III–V layer of polycrystalline material;
   a second oxidized Group III–V layer upon said layer of polycrystalline material, the second oxidized Group III–V layer being one of an Al bearing polycrystalline and amorphous material.

2. The distributed Bragg reflector of claim 1 wherein the second oxidized Group III–V layer comprises an oxide of an amorphous (Al, As) layer.

3. The distributed Bragg reflector of claim 1 wherein the second oxidized Group III–V layer comprises an oxide of a polycrystalline AlAs layer.

4. The distributed Bragg reflector of claim 1 wherein the first Group III–V layer comprises one of the group consisting of GaAs, GaN and GaP.

5. The distributed Bragg reflector of claim 1 wherein the second oxidized Group III–V layer comprises an oxide of one of amorphous and polycrystalline Al$_x$Ga$_{1-x}$P (x>0.9).

6. The distributed Bragg reflector of claim 1 wherein the first Group III–V layer comprises an Al$_x$In$_y$Ga$_{1-x-y}$N (x>0.9) layer.

7. The distributed Bragg reflector of claim 6 wherein the second oxidized Group III–V layer comprises an oxide of one of amorphous and polycrystalline AlInGaN.

8. The distributed Bragg reflector of claim 6 wherein an Al composition of the first Group III–V layer is lower than an Al composition of the second oxidized Group III–V layer.

9. A distributed Bragg reflector, comprising:
   a plurality of alternating layers, each adjacent pair of the alternating layers comprising a first Group III–V layer including a non-Al-bearing polycrystalline layer and a second oxidized Group III–V layer including one of an amorphous and a polycrystalline Al-bearing layer.

10. The distributed Bragg reflector of claim 9 wherein a difference in indices of refraction between the first Group III–V layer and the second Group III–V layer is greater than 50% of the index of refraction of said second Group III–V layer.

11. The distributed Bragg reflector of claim 9 wherein the first Group III–V layer comprises one of the group consisting of GaAs, GaN and GaP.

12. The distributed Bragg reflector of claim 9 wherein the second Group III–V layer comprises one of Al$_2$O$_3$, InAlPO$_4$, Al$_x$Ga$_{1-x}$PO$_4$ (x>0.9), and Al$_x$In$_y$Ga$_{1-x-y}$NO$_z$ (x>0.9).

* * * * *